United States Patent [19]

Kurosawa et al.

[11] Patent Number: 5,598,105
[45] Date of Patent: Jan. 28, 1997

[54] ELEMENTARY CELL FOR CONSTRUCTING ASYNCHRONOUS SUPERCONDUCTING LOGIC CIRCUITS

[75] Inventors: Itaru Kurosawa, Tsukuba; Hiroshi Nakagawa, Ushiku; Masahiro Aoyagi; Masaaki Maezawa, both of Tsukuba; Takashi Nanya, Kawasaki; Yoshio Kameda, Narashino, all of Japan

[73] Assignee: Agency of Industrial Science & Technology, Ministry of International Trade & Industry, Tokyo, Japan

[21] Appl. No.: 562,746

[22] Filed: Nov. 27, 1995

[30] Foreign Application Priority Data

Dec. 16, 1994 [JP] Japan .................................. 6-313015

[51] Int. Cl.⁶ .................................................. H03K 19/195
[52] U.S. Cl. .................................. 326/6; 326/1; 326/3
[58] Field of Search .................................. 326/1, 2, 3, 4, 326/6, 7

[56] References Cited

U.S. PATENT DOCUMENTS

| | | | |
|---|---|---|---|
| 4,012,642 | 3/1977 | Gueret | 326/6 |
| 4,097,765 | 6/1978 | Zappe | 326/6 |
| 4,713,562 | 12/1987 | Hasuo | 326/6 |
| 5,164,618 | 11/1992 | Murphy | 326/6 |
| 5,233,242 | 8/1993 | Murphy | 326/6 |
| 5,233,243 | 8/1993 | Murphy | 326/6 |

*Primary Examiner*—Edward P. Westin
*Assistant Examiner*—Andrew Sanders
*Attorney, Agent, or Firm*— Oblon, Spivak, McClelland, Maier & Neustadt, P.C.

[57] ABSTRACT

An elementary cell uses single-flux-quanta as two-valued logic propagation signals and is effective for Constructing asynchronous superconducting logic circuits. The elementary cell comprises one OR circuit section and one AND circuit section. Input pulses applied to two input terminals of the elementary cell are split at signal splitting sections in the elementary cell and applied to both inputs of the OR circuit section and both inputs of the AND circuit section. The output of the OR circuit section is defined as the OR output of the elementary cell. A first arrival pulse memory section is provided in the AND circuit section and when one of two input pulses input to the two input terminals of the AND circuit section arrives before the other, this fact is recorded in the first arrival pulse memory section as logical "1". When the other input pulse arrives while logical "1" is recorded in the first arrival pulse memory section, the AND circuit section produces an AND output which is defined as the AND output of the elementary cell. When a reset signal pulse is applied to a reset terminal, the first arrival pulse memory section is reset.

12 Claims, 4 Drawing Sheets

FIG. 5A PRIOR ART
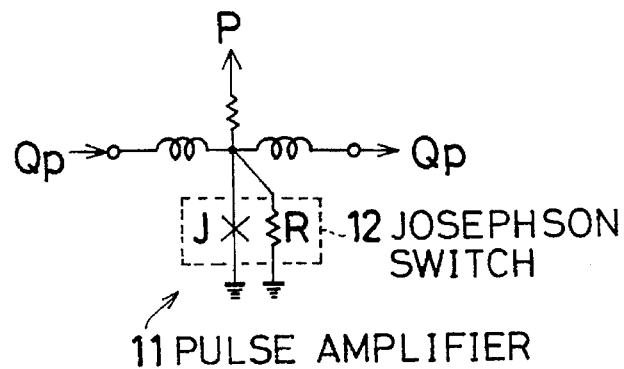
FIG. 5B PRIOR ART
FIG. 5C PRIOR ART
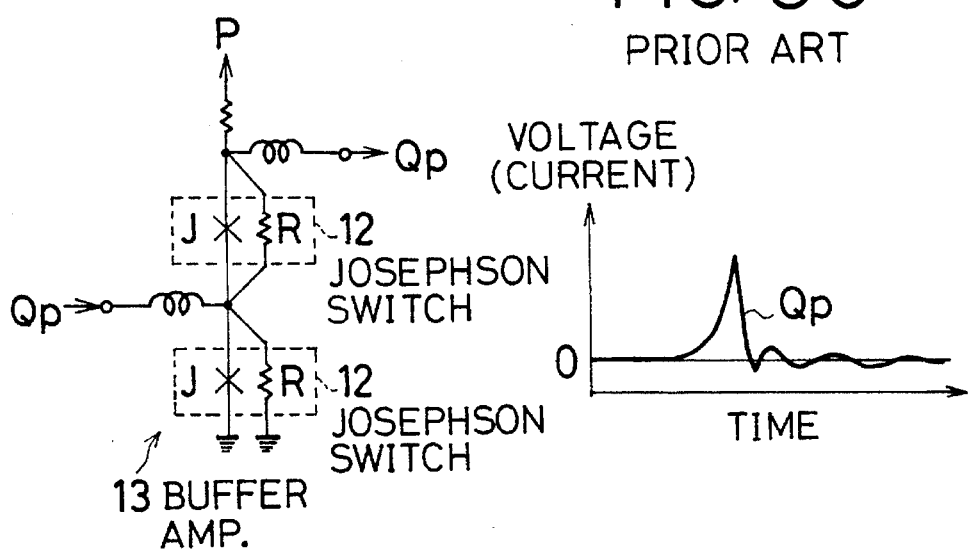
FIG. 5D PRIOR ART
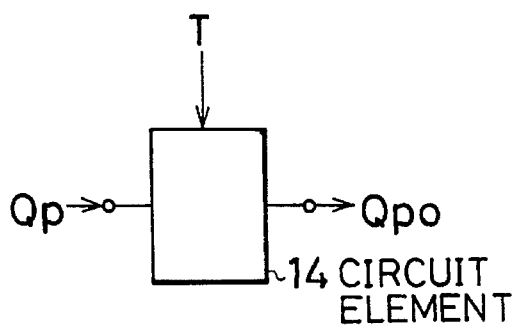
FIG. 5E PRIOR ART
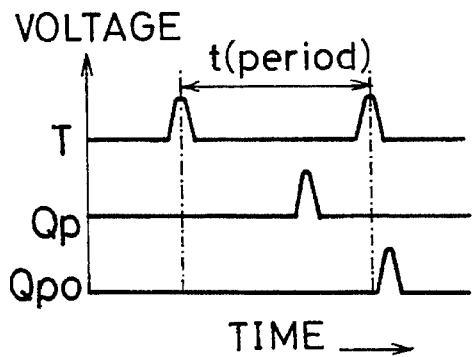

ELEMENTARY CELL FOR CONSTRUCTING ASYNCHRONOUS SUPERCONDUCTING LOGIC CIRCUITS

BACKGROUND OF THE INVENTION

1. Field of the Invention

This invention relates to an elementary cell effective for constructing asynchronous superconducting logic circuits handling single-flux-quantum pulses.

2. Description of the Prior Art

Today's computers ordinarily use a synchronous processor as one of their basic components, irrespective of whether they employ semiconductor logic circuits or superconducting logic circuits using Josephson devices. In "RSFQ Logic/Memory Family: A New Josephson-Junction Technology for Sub-Terahertz-Clock-Frequency Digital Systems," IEEE Trans. Appl. Superconductivity, Vol. 1, No. 1, pp. 3–28 (1991), K. K. Likharev and V. K. Semenov propose a RSFQ (rapid single-flux-quantum) circuit for constructing high-speed synchronous logic circuits using Josephson devices.

While this RSFQ circuit handles signals as single-flux-quanta (SFQ), it is also characterized by the pulse amplifier required in the actual circuit for enabling propagation of the pulse signals. The principle of the pulse amplifier 11 used in the circuit is illustrated in FIG. 5(A). Generally speaking, the Josephson device J has a hysteresis characteristic. Specifically, when a current exceeding the critical current is passed through the device, it shifts from the zero-voltage state up to that time to a voltage state, whereafter it does not return to the zero-voltage state unless the voltage applied across the device terminals falls almost completely to zero. This is known as "latching" mode operation. In a circuit using latching Josephson devices, therefore, the individual devices have to be periodically reset by use of alternating driving current (pulse current), the rise and fall timing has to be strictly controlled, and the frequency cannot be made very high. In contrast, in the pulse amplifier 11 used with this RSFQ, the Josephson device J is used as a non-latching Josephson switch 12 whose hysteresis characteristic has been deliberately nullified by, as shown in the drawing by way of example, connecting an overdamping resistor R in parallel with the Josephson device J and other such measures. In principle, the parallel resistor R and the like are not absolutely necessary if use is made of a so-called weakly coupled Josephson device, which does not have a hysteresis characteristic. In terms of device production technology, however, junction type devices and the like having hysteresis are easier to obtain with good characteristics. Generally, therefore, a device with hysteresis is used together with a parallel resistor R, as shown in the drawing.

Since the RSFQ circuit using the non-latching Josephson switch 12 can be driven by a DC power source P, it is at least freed from restriction to an AC power source. When an input pulse Qp is applied to a pulse amplifier 11 constituted by inserting a non-latching Josephson switch 12 between a DC power source P and ground, as shown in FIG. 5(A) for example, the non-latching Josephson switch 12 once shifts to a voltage state owing to superimposition of the current from the DC power source and the input pulse Qp. However, since this shift to the voltage state causes the amount of power source current flowing into the Josephson device J to decrease gradually with passage of time, the Josephson device J eventually resets itself and returns to the zero-voltage state since it has no hysteresis characteristic. As shown in FIG. 5(C), therefore, the output pulse Qp obtained at the output terminal once exhibits a large voltage (current) rise but eventually decreases gradually with lapse of time.

For achieving the desired handling of SFQ $\Phi o$ pulses, it is necessary for the product ($L \cdot Io$) of the inductance value L of the inductors provided in the input line to and the output line from the non-latching Josephson switch 12 and the device critical current value Io to be no greater than 0.5 $\Phi o$. The value of the inductance L of the inductors can, however, be set with relative freedom within this range. Actually, it is not so common to add inductance because the inductance L of the signal propagation lines generally suffices. The point remains, however, that positive, intentional adjustment of the inductance value L can be used to regulate the pulse width, pulse sharpness and other parameters affecting the pulse waveform as well as to regulate the amplification factor (magnitude of the critical current) of the individual stages when multiple pulse amplifier 11 of this type are cascaded. It should be noted that this possibility also applies regarding the various inductances indicated in the drawings of the embodiments of the invention to be described hereinafter.

FIG. 5(B) shows a buffer amplifier 13 obtained by modifying the pulse amplifier 11 of FIG. 5(A) so as to prevent operating errors owing to reverse signal flow from the output side toward the input side. A pair of non-latching Josephson switches 12, 12 are connected in series between the power source P and ground such that, with respect to a pulse Qp applied to the input, the non-latching Josephson switch 12 provided on the upper side in the drawing does not switch because the direction of current application is reverse between the power source and the input pulse and only the lower non-latching Josephson switch 12 shifts to the voltage state, whereby power source current is diverted to the output terminal side to provide an amplified output pulse Qp such as shown in FIG. 5(C). On the other hand, if a pulse signal should be erroneously input from the output terminal side, the superimposition of the input signal and the power source current shifts the upper non-latching Josephson switch 12 to the voltage state for a given period since it is fabricated to have a smaller critical current value than the lower non-latching Josephson switch 12. As a result, the signal is prevented from flowing in reverse and does not affect the input side.

As shown in FIG. 5(D), however, when the pulse Qp propagating through the lines of the logic circuit with its signal level attenuation reduced by the pulse amplifier 11 or the buffer amplifier 13 is observed from the viewpoint of an arbitrary circuit element 14 to which it is propagated, the current value or voltage value at the input of the circuit element is zero both before and after the pulse Qp arrives, so that no distinction is possible without some modification. In the prior-art RSFQ, therefore, a circuit element 14 which has to recognize signal arrival is supplied with a timing signal T of period t so that, as shown in FIG. 5(E), the presence of the input pulse Qp is recognized at the end of the period t and an output pulse Qpo is produced only if the pulse Qp arrives within the period t. (While the circuit element 14 is shown as having a single input in the drawing, this is only for simplifying the explanation and it is possible for it to be a flip-flop circuit or an arithmetic logic circuit incorporating a flip-flop circuit.)

Thus while the prior-art RSFQ circuit discussed in the foregoing does not need an AC power source, it requires a timing signal T, namely, a clock signal in the case of constructing a logic system, and, therefore, it goes without saying that the system is limited to the synchronous type.

While it is true, as pointed out at the beginning of this specification, that among the various synchronous systems, the system constructed according to the configuration principle of the RSFQ circuit which handles SFQ pulses as logic signals has many superior aspects, the fact that it is a synchronous system means that, as with other synchronous systems, the basic performance, particularly the upper limit of the operating speed, is restricted by the clock frequency.

The remarkable advances made in Josephson device technology in recent years can be seen, for example, from ultra-high speed devices with switching delay times of only several picoseconds that have been achieved in the laboratory. In a synchronous system constructed on a chip with an area typical of current integrated circuits (10 mm×10 mm), however, the system performance saturates when the device operating delay time reaches a maximum of several tens of picoseconds. This is because the signal propagation delay time of the wiring makes it impossible to distribute a clock signal matched to the device speed. Thus, even though LSIs using devices which themselves have operating speeds on this order have actually been realized, they are unable to fully utilize the ultra-speed operating capability of the Josephson devices they include. Although devices with operating speeds of one picosecond are expected before the end of the century, the extent to which the ultra-high speed of these devices can be reflected in system performance is clearly limited in the case of synchronous systems. In fact, synchronous systems are currently very near reaching their limit in this respect, if they haven't reached it already.

One solution to this problem is to use the asynchronous system configuration which operates without a clock based solely on the causality of event occurrence. The performance of an asynchronous processor is determined not by the "maximum value" but by the "average value" of the processing and the delay. Since it is unaffected by unpredictable timing changes and the like, the high-speed capability of the device can be directly reflected in the system performance, so that the power of the system increases with increasing device operating speed.

However, it is not possible to apply the configuration principle of the synchronous logic circuits in the RSFQ circuit discussed in the foregoing to an asynchronous system without modification. A circuit element which, like the basic pulse amplifier 11 shown in FIG. 5(A) or the buffer amplifier 13 shown in FIG. 5(B), for example, responds to mere application of a signal pulse Qp by simply amplifying its voltage or current level, can be used substantially as it is in an asynchronous system because there is no need to consider the presence of a timing signal. (It is for this reason that the pulse amplifier 11 and buffer amplifier 13 shown in FIG. 5 are used in embodiments of the invention described later.) However, when a logical operation requires that the time of signal arrival be known with certainty, as in the case of the circuit element 14 schematically shown in FIG. 5(D), the circuit, in which the presence of a timing signal T is indispensable, can obviously not be used in an asynchronous system. In other words, if the circuit construction principle of the RSFQ is to be followed, with or without modification, freeing it from the constraints of the synchronous system and moving forward with its application to the asynchronous system requires that a circuit be developed which is capable of arithmetic processing without involving a timing signal, even when the signal representing the two-valued logic is a single-flux-quantum pulse. The present invention was accomplished precisely for this purpose and has as its object to provide an elementary cell useful for constructing asynchronous superconducting logic circuits.

SUMMARY OF THE INVENTION

An asynchronous system is generally configured using a pair of complementary signal lines consisting of an affirmation line for passing the affirmation value x of a two-valued variable and a negation line for passing the negative value x_ thereof. (The symbol "_" is read "bar" and stands for inverted logic.) In terms of positive logic, pulse propagation by the affirmation line represents logical "1" and pulse propagation by the negation line represents logical "0". Simultaneous propagation of pulses on the affirmation and negation lines does not occur. The basic function circuits required for constructing a logic circuit are the NOT circuit, the OR circuit and the AND circuit. If these are available, any other desired logic circuits (such as the exclusive OR circuit widely used in various types of logic circuits) can be configured. When the aforesaid pair of complementary signal lines is used, the NOT circuit can be easily realized by interchanging the affirmation and negation lines. For realizing OR circuits and AND circuits suitable for an asynchronous system, however, it is necessary for the circuits to satisfy the following two points:

(1) Tolerate differences in the input pulse arrival times; and (2) Enable circuit resetting and acceptance of the next input at the time of output.

This invention therefore provides an elementary cell comprising the following group of constituent elements (a)–(d) as an elementary cell which satisfies the conditions (1) and (2) and is preferable for constructing asynchronous superconducting logic circuits.

(a) Two inputs each of which receives as an input pulse a logic signal pulse propagated as a single-flux-quantum;

(b) An OR circuit section which produces an OR output pulse when an input pulse is applied to at least one of the two inputs;

(c) A first arrival pulse memory section for recording arrival of an input pulse which arrives earlier at one of the two inputs;

(d) An AND circuit section including the first arrival pulse memory section, which produces an AND output pulse when the arrival of the input pulse is recorded in the first arrival pulse memory section and an input pulse arrives at the other of the two inputs and which erases any content of the first arrival pulse memory section when it receives a reset signal pulse on a reset input thereof.

According to the aforesaid configuration of the invention, the existing RSFQ circuit using Josephson devices operating in the latched mode for handling signals as SFQ propagated pulses is improved not only by making it unnecessary to provide an AC power source (pulsating current source) for precisely defining timing relationships throughout the system but also by removing the constraints of the synchronous system. More specifically, the invention enables efficient and highly reliable construction of asynchronous superconducting logic circuits which do not require a clock signal, which, if used, would owing to its frequency cause system performance saturation notwithstanding that this frequency can be set adequately high relative to the pulsating current frequency, and, because of this, makes it possible to fully reflect the ultra-high operating capability of the non-latching Josephson switches included in its individual circuits. In other words, the considerable effect manifested by the invention can be expected to increase in proportion as the performance of Josephson devices increases in the future.

The invention also provides elementary cells which in addition to the basic constituent elements (a)–(d) also include one, some or all of the following group of constituent elements (e)–(m).

(e) The AND circuit section produces an AND output pulse without recording the arrival of an input pulse when input pulses arrive at the two inputs simultaneously.

(f) The OR circuit section is constituted by connecting the two inputs to a power source side of a non-latching Josephson switch and the OR output pulse is obtained from these connection terminals.

(g) A pulse amplifier for amplifying the OR output pulse including a non-latching Josephson switch.

(h) The first arrival pulse memory section comprises:
a closed superconducting loop including in serial connection first, second and third non-latching Josephson switches and an inductor having inductance in a range enabling capture of one single-flux-quantum, the first non-latching Josephson switch being applied with power source current and the input pulses applied to the two inputs,
the second non-latching Josephson switch being applied with only the input pulses applied to the two inputs,
the reset signal pulse being applied to one terminal of the third non-latching Josephson switch,
the first non-latching Josephson switch shifting to a voltage state for a prescribed period of time for capturing a single-flux-quantum in the closed superconducting loop when an input pulse is applied to one of the two inputs at a time when no single-flux-quantum is captured by the closed superconducting loop,
the second non-latching Josephson switch shifting to a voltage state for a prescribed period of time for producing an AND output pulse when an input pulse is applied to one of the two inputs at a time when a single-flux-quantum is captured by the closed superconducting loop, and
the third non-latching Josephson switch shifting to a voltage state for a prescribed period of time for discharging from the closed superconducting loop the single-flux-quantum captured by the closed superconducting loop when the reset signal pulse is applied at a time when the single-flux-quantum is captured by the closed superconducting loop.

(i) A pulse amplifier for amplifying the AND output pulse including a non-latching Josephson switch.

(j) A non-latching Josephson switch which is provided in a signal line for applying a reset signal pulse to the third non-latching Josephson switch and which operates to prevent capture of a single-flux-quantum by the closed superconducting loop from being caused by a shift to the voltage state owing to application of the reset signal pulse when no single-flux-quantum is captured by the closed superconducting loop.

(k) The OR circuit section is constituted to share the first non-latching Josephson switch for constituting the first arrival pulse memory section, the two inputs are connected to the power terminal side of this first non-latching Josephson switch and the OR output pulse is obtained from this connection terminal.

(l) An amplification circuit which includes a pulse amplifier using a non-latching Josephson switch and is provided at a signal splitting section for distributing the two inputs to two inputs of the AND circuit section and two inputs of the OR circuit section.

(m) An output terminal which passes the reset signal pulse upon receiving the same.

BRIEF DESCRIPTION OF THE DRAWINGS

FIG. 5(A) is the circuit diagram of a non-latching pulse amplifier capable of self-resetting.

FIG. 5(B) is the circuit diagram of a non-latching buffer amplifier capable of self-resetting.

FIG. 5(C) is a waveform diagram of the output pulse obtained at the output of the amplifier of FIG. 5(B).

FIG. 5(D) is a diagram for explaining a circuit element requiring timing input in a prior-art synchronous superconducting logic circuit.

FIG. 5(E) is a diagram regarding the circuit element shown in FIG. 5(D) for explaining the time relationship among the occurrences of an input pulse, a timing signal and an output pulse.

DESCRIPTION OF THE PREFERRED EMBODIMENTS

Figure 1A:
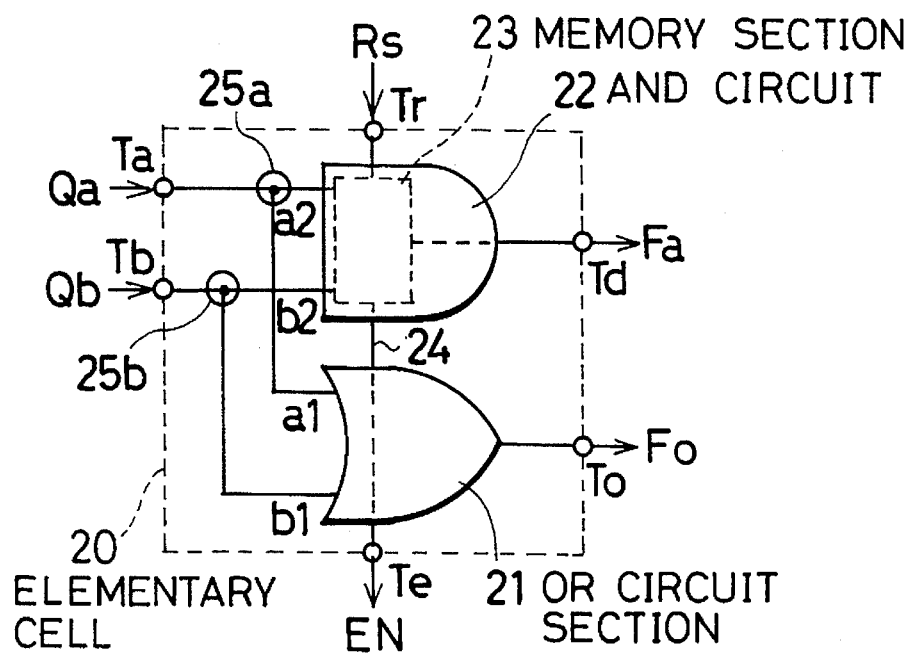
FIG. 1(A) is a circuit diagram using circuit symbols to schematically represent an elementary cell fabricated in accordance with this invention.

FIG. 1 uses circuit symbols to represent the functions to be performed by an elementary cell 20 constituted according to the invention for use in constructing asynchronous superconducting logic circuits. The elementary cell 20 of the invention is similar to the prior-art synchronous RSFQ circuit explained earlier in that it handles SFQ pulses as logic signals. However, it is for application to an asynchronous system, not a synchronous system, and, moreover, is designed to enable construction of almost all required combinational logic circuits.

The elementary cell 20 has two input terminals designated Ta, Tb. Input pulses (SFQ pulses) Qa, Qb selectively applied to the respective input terminals Ta, Tb are distributed by signal splitting sections 25a, 25b in the interior of the elementary cell 20 so that each input pulse is sent to one of two inputs a1, b1 of an OR circuit section 21 and one of two inputs a2, b2 of an AND circuit 22. The OR circuit section 21 outputs an output pulse Fo (an SFQ pulse) from its output terminal To when at least one of the inputs a1, a2 is input with an input pulse Qa or Qb. The output pulse Fo is therefore the OR output Fo of the elementary cell 20.

If the AND circuit 22 were an ordinary AND circuit as suggested by the AND circuit symbol in FIG. 1, it would output an AND output Fa from its output terminal Td only when the input pulses Qa, Qb are both input to the inputs a2, b2. For application of the elementary cell 20 to an asynchronous logic circuit, however, some measure is necessary for enabling the AND circuit 22 to tolerate cases in which the input pulses Qa, Qb are never input simultaneously, namely, cases in which the input pulses Qa, Qb arrive at the input terminals Ta, Tb at different times. The elementary cell 20 of this invention therefore has a memory section 23 which responds to the arrival of an input pulse Qa or Qb at one input terminal Ta or Tb (and thus at one input a2 or b2 of the AND circuit 22) earlier than the arrival of an input pulse Qa or Qb at the other input Ta or Tb by recording the fact of the arrival of the input pulse, which may be either of the two input pulses. If when the arrival of an input pulse is recorded in the memory section 23 an input pulse Qb or Qa then arrives at the other of the two inputs, the AND circuit 22 produces an AND output Fa. This arrangement enables the AND circuit 22 to tolerate signal arrival time differences without adopting the technique utilized by the prior-art synchronous system using a clock signal for recognizing the arrival of the input signals Qa, Qb. As a result, the AND operation can be performed after both inputs Qa, Qb have been received, thus enabling application to an asynchronous system.

After the AND operation has been completed, it is necessary to restore the state enabling acceptance of the next input pulse. For this it is at least necessary to put the elementary cell 20 in a state enabling it to be reset upon input of a reset signal Rs. The elementary cell 20 is therefore configured so that the first arrival pulse memory section 23 is reset (its content is erased) when a reset signal Rs is applied to a reset input terminal Tr. As explained later with reference to FIGS. 3 and 4 regarding concrete examples of constructing asynchronous combinational logic circuits using multiple elementary cells 20, a resettable elementary cell 20 can be simply obtained by, for example, having the elementary cell 20 use its own output pulse to produce its own reset signal Rs and feeding this reset signal Rs back to the reset input terminal Tr. In addition, the elementary cell 20 should preferably be provided with a line 24, as shown by a phantom line in FIG. 1, for passing the reset signal pulse Rs and enabling it to be output to an output terminal Te as an input enable signal EN for informing other circuits that the elementary cell 20 is in an input enable state. The elementary cell 20 is further configured to immediately output an AND output Fa when the AND circuit 22 receives the input pulses Qa, Qb simultaneously, since there is obviously no need to use the first arrival pulse memory section 23 in such cases.

Figure 1B:
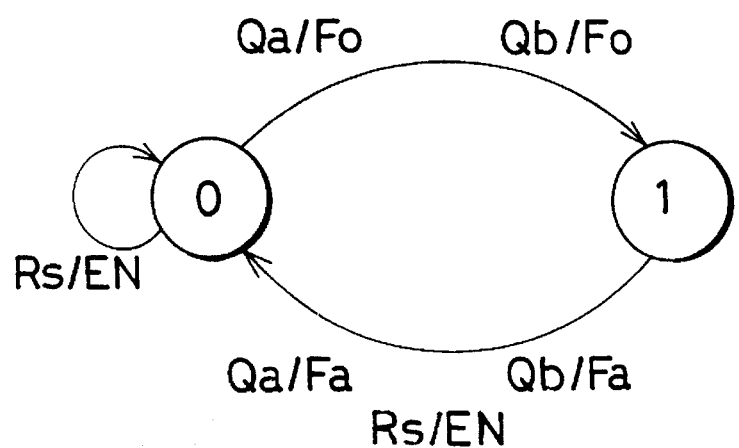
FIG. 1(B) is a state transition diagram of the elementary cell shown in FIG. 1(A).

FIG. 1(B) is a state transition diagram of the operation of the elementary cell 20 shown in FIG. 1(A) as seen from the state of the first arrival pulse memory section 23. The state of the first arrival pulse memory section 23 when it has recorded that an input pulse was received is represented as "1" and other states (including the erased state) are represented as "0". Input signals appear before, and output signals after, the slashes. In other words, the invention provides an elementary cell 20 which performs the operations defined by the state transition diagram of FIG. 1(B). Upon the arrival of even one of the input pulses Qa, Qb when the first arrival pulse memory section 23 is in the "0" state, the elementary cell 20 outputs an OR output Fo and the state of the internal first arrival pulse memory section 23 becomes "1". Upon the arrival of one of the input pulses Qa, Qb when the first arrival pulse memory section 23 is in the "1" state, the elementary cell 20 outputs an AND output Fa and the first arrival pulse memory section 23 is reset to the "0" state. If the reset signal Rs is applied when the first arrival pulse memory section 23 is in the "1" state, the first arrival pulse memory section 23 is reset and input enable signal EN is output. If the reset signal Rs is applied when the first arrival pulse memory section 23 is in the "0" state, the input enable signal EN is output but the state of the first arrival pulse memory section 23 remains unchanged. As can be seen from the state transition diagram of FIG. 1(A), the elementary cell 20 is configured to tolerate the arrival of the input pulses Qa, Qb at the input terminals Ta, Tb at different times but is not designed to tolerate continuous application of one of the input pulses Qa and Qb without arrival of the other. This is because there is no need in actual practice for a circuit with this capability.

FIG. 2 shows a circuit which is a specific example of a preferable configuration of the elementary cell 20 shown in FIG. 1(A). This example circuit is shown also to include amplification circuits and the like to compensate for pulse signal propagation loss. The pulse amplifiers 11 and buffer amplifiers 13 used for these can be the same as the existing types designated by reference symbols 11 and 13 in FIG. 5 and explained earlier and do not require any particular modification for use in this invention. The explanation given earlier regarding these circuits therefore also applies to the explanation of the specific circuit examples of the present invention. For example, although the pulse amplifiers 11 and buffer amplifiers 13 of the circuit of FIG. 2 are also shown to include non-latching Josephson switches 12 whose hysteresis is intentionally eliminated by attaching resistors R in parallel with a Josephson devices J, it is instead possible to use any type of non-latching Josephson switch exhibiting good characteristics as the non-latching Josephson switches 12, including, for example, so-called weakly coupled devices of the microbridge type and the like, and to eliminate the parallel resistor R.

Figure 2A:
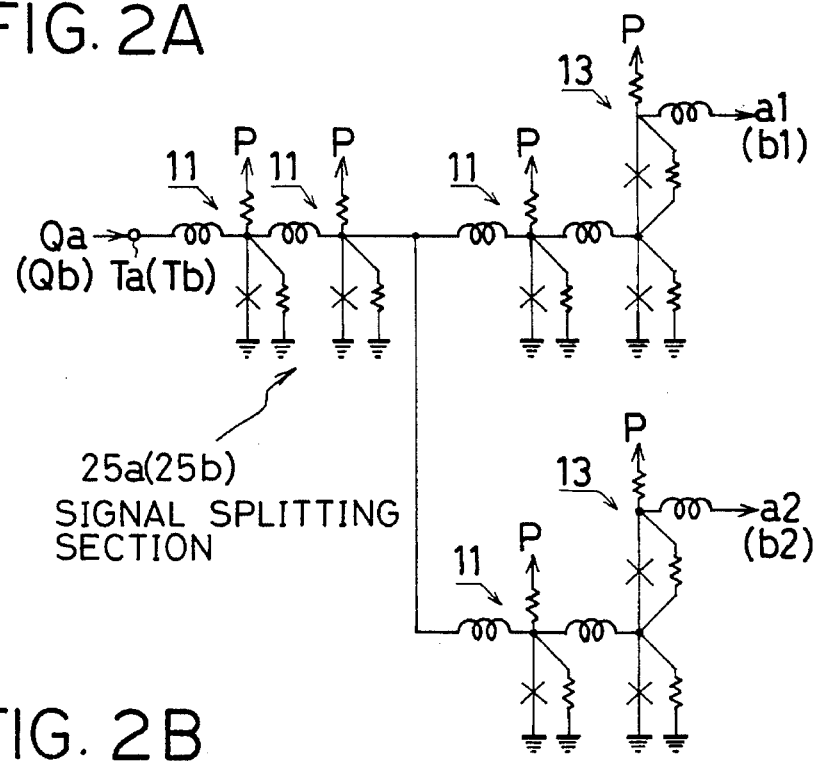
FIG. 2(A) is circuit diagram more explicitly showing a branch section in the elementary cell shown in FIG. 1(A).

In this preferred example, therefore, the signal splitting sections 25a, 25b, which in the elementary cell 20 of FIG. 1(A) are indicated simply as branch points for distributing the input pulses Qa, Qb applied to the input terminals Ta, Tb to the inputs a1, b1 of the OR circuit section 21 and the inputs a2, b2 of the AND circuit 22, are, as shown in FIG. 2(A), constituted using amplification circuit configurations which amplify the input pulses in terms of voltage value or current value to not less than a prescribed level (i.e., normalize the pulse magnitude and/or shape the pulse wave). While the drawing shows only the circuit for one of the input pulses Qa and Qb, in the actual configuration one of each amplifier shown in FIG. 2(A) is provided for each input pulse Qa, Qb. In the figure, the group of symbols not enclosed in parentheses corresponds to the circuit for one input pulse and those in parentheses to the circuit for the other input pulse.

An input pulse Qa arriving at the input terminal Ta passes through two-stage cascaded pulse amplifiers 11 and is then distributed to two signal lines. Each of the two signal lines to which the signal is distributed is provided with a pulse amplifier 11 and a buffer amplifier 13 which further amplifies the output of the preceding stage while preventing input/output interference. The output of one buffer amplifier 13 is connected with one input a1 of the OR circuit section 21 shown in FIG. 2(B) and the output of the other is connected with one input a2 of the AND circuit 22 shown in the same figure. In exactly the same manner, the inpulse Qb arriving at the input terminal Tb passes through two-stage cascaded pulse amplifiers 11 and is then distributed to two signal lines. Each of the two signal lines to which the signal is distributed is provided with a pulse amplifier 11 and a buffer amplifier 13 which further amplifies the output of the preceding stage while preventing input/output interference. The output of one buffer amplifier 13 is connected with an input b1 of the OR circuit section 21 shown in FIG. 2(B) and the output of the other is connected with one input b2 of the AND circuit 22 shown in the same figure. Although in the illustrated circuit non-latching Josephson switches are shown to be inserted in series into the lines to the inputs a1, b1, a2, b2 in FIG. 2(B), they are not related to the operating principle and can be omitted.

The active circuit performing the substantial OR operation in the OR circuit section 21 is configured as a pulse amplifier having a non-latching Josephson device J1 of substantially the same configuration as the aforesaid pulse amplifier 11 and a gate resistor Rp which receives driving current from the power source P, but the power supply terminal side of the non-latching Josephson device J1 is applied with both input pulses Qa, Qb through the terminals a1, b1 communicating back to the input terminals Ta, Tb. Therefore, if either of the input pulses Qa, Qb is intentionally input as logical "1", the non-latching Josephson device J1 will reset itself after once shifting to the voltage state for a prescribed period, whereby the output pulse is preferably amplified by the pulse amplifier 11 and appears at the output terminal To of the elementary cell 20 as the OR output Fo.

Figure 2B:
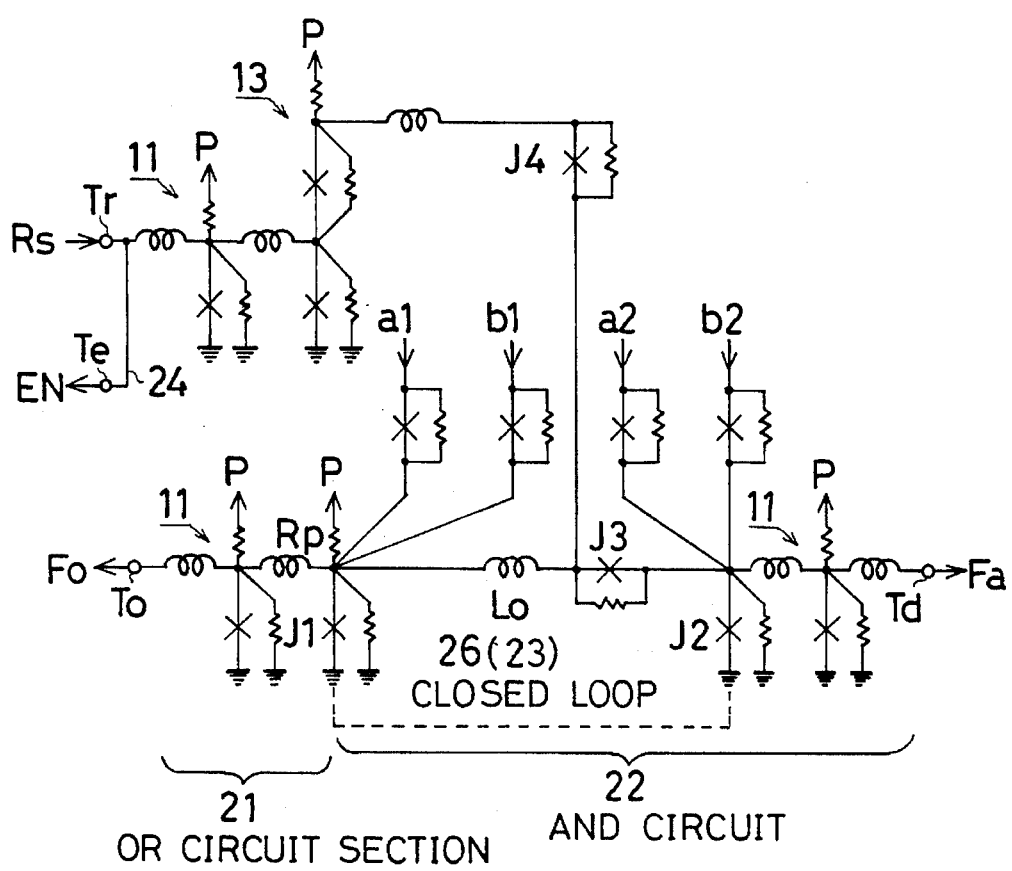
FIG. 2(B) is a circuit diagram more explicitly showing an OR circuit section and an AND circuit section in the elementary cell shown in FIG. 1(A).

The AND circuit 22 has the first arrival pulse memory section 23 which in the circuit configuration shown in FIG. 2(B) comprises a superconducting closed loop 26 consisting of the first non-latching Josephson device J1, second and third non-latching Josephson devices J2, J3, and a series-connected inductor Lo of an inductance in a range enabling capture of one SFQ $\Phi o$. As shown by a phantom line, a part of the superconducting closed loop 26 is constituted of a ground circuit. As can be seen, in this example the OR circuit section 21 and the AND circuit 22, more specifically the first arrival pulse memory section 23 thereof, share the non-latching Josephson device J1.

If even one input pulse Qa or Qb is input to the input terminal Ta or Tb when no SFQ is captured in the superconducting closed loop 26, at least one input pulse signal is applied to the input terminal a1 or b1 and superimposed on the power source current applied to the first non-latching Josephson device J1 through the resistor Rp. As a result, the first non-latching Josephson device J1 once shifts to the voltage state, whereby an SFQ is captured in the superconducting closed loop 26. This is the state of the first arrival pulse memory section 23 when the arrival of an input pulse is recorded therein. Next, when the other of the input terminals Ta, Tb of the elementary cell 20 receives the other input pulse Qa or Qb, the other input terminal a2 or b2 of the AND circuit 22 is applied with a pulse signal. The current component produced as a result is superimposed on the current produced owing to presence of the SFQ captured in the superconducting closed loop 26 (flowing clockwise in the figure), whereby the second non-latching Josephson switch J2 once shifts to the voltage state. As a result, an AND output Fa is output as anticipated to the output terminal Td of the elementary cell 20 and, owing to this operation, the captured SFQ is discharged from the superconducting closed loop 26 to restore the state of the superconducting closed loop 26 to logical "0". Preferably, as shown in the figure, the output circuit for the AND output pulse also includes a pulse amplifier 11.

When the input pulses Qa, Qb are received at the input terminals Ta, Tb of the elementary cell 20 at exactly the same time, it is desirable for the AND output Fa to be immediately sent to the output terminal Td without capturing a flux-quantum in the superconducting closed loop 26. This can be easily achieved by setting the critical current value of the second non-latching Josephson switch J2 so that it shifts to the voltage state only when the current components of the input signals are superimposed (added together) owing to simultaneous application at the inputs a2, b2 of the AND circuit section.

The input of a reset signal Rs to the reset input terminal Tr of the elementary cell 20 will now be considered. Since inputting a reset signal Rs to the reset input terminal Tr at a time when an SFQ is captured in the superconducting closed loop 26 results in its being applied to the terminal of the third non-latching Josephson switch J3 on the upstream side of the persistent current flowing in the superconducting closed loop 26, the superimposition on the currents causes the third non-latching Josephson switch J3 to shift to the voltage state for a prescribed time period, whereby the captured SFQ is discharged and the circuit is reset. At this time no significant logic signal appears at the OR output terminal To or the AND output terminal Td. On the other hand, inputting a reset signal Rs at a time when the logical state of the superconducting closed loop 26 is "0," i.e. at a time when no SFQ is trapped therein, has no adverse effect on the circuit because at that time the fourth non-latching Josephson switch J4, which is connected in series with the line carrying the reset signal Rs, shifts to the voltage state. In the illustrated circuit, output of an input enable signal EN to the exterior for informing other circuits that the elementary cell 20 has been reset and is in an input enable state, is made possible simply by providing a line connecting the output terminal Te of the input enable signal with the reset input terminal Tr. This line can of course also be provided with a pulse amplifier 11 or a buffer amplifier 13.

Figure 3:
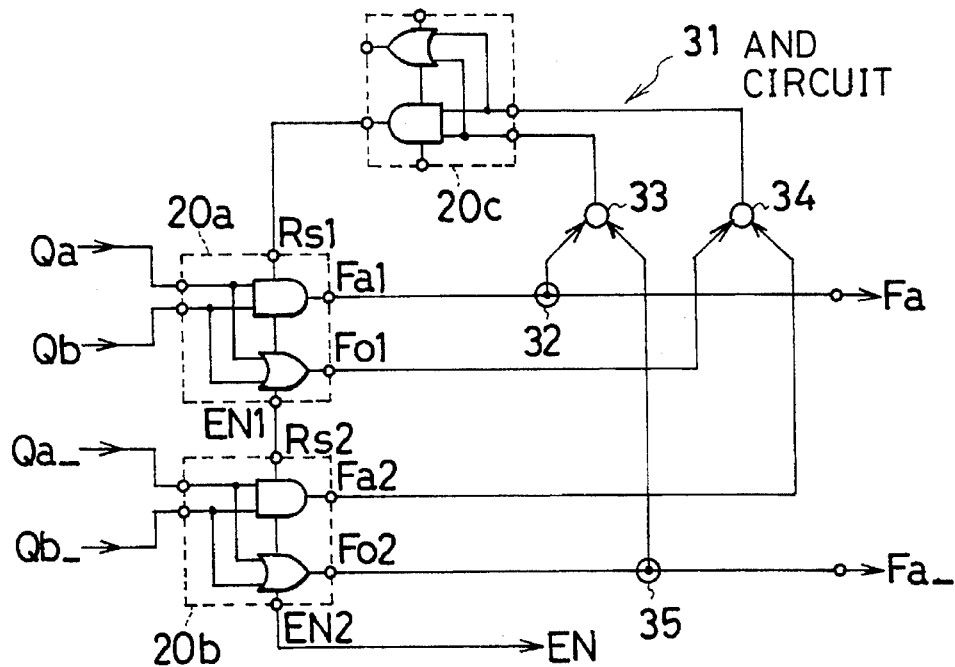
FIG. 3 is a circuit diagram showing an asynchronous AND circuit for a complementary signal pair constructed using elementary cells according to the invention.
Figure 4:
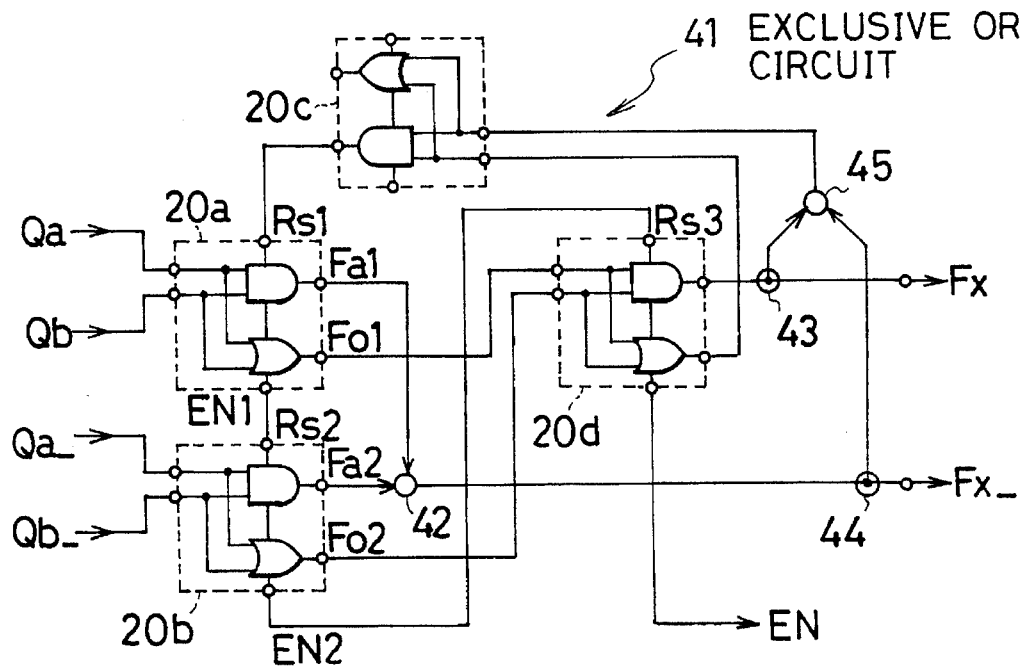
FIG. 4 is a circuit diagram showing an exclusive OR circuit for a complementary signal pair constructed using elementary cells according to the invention.

As described in the foregoing, the elementary cell 20 provided by the invention is ideal for enabling asynchronous operation of the existing synchronous RSFQ circuit and, moreover, since it includes the OR circuit section 21 and the AND circuit 22 therein, it can, in combination with the NOT circuit achievable simply by interchanging the pair of complementary signal lines as mentioned earlier, be embodied as almost any combinational logic circuit needed for constructing an asynchronous superconducting logic circuit. This can be clearly seen from the examples of FIGS. 3 and 4. FIG. 3 shows how an AND circuit 31 for an asynchronous complementary signal pair can be configured using three elementary cells 20 (denoted as 20a, 20b and 20c), while FIG. 4 shows how an exclusive OR circuit 41 for an asynchronous complementary signal pair can be configured using four elementary cells 20 (denoted as 20a, 20b, 20c, and 20d). While the first arrival pulse memory sections 23, the lines 24 and the like of the elementary cells 20 are not shown in FIGS. 3 and 4, the operation of the elementary cells 20 is the same as that explained earlier with reference to FIGS. 1 and 2. Further, while the reference symbols 21–25 designating the first arrival pulse memory sections 23, lines 24, signal splitting sections 25a, 25b, and the OR circuit section 21 and AND circuit 22 included in the elementary cells 20 are also omitted from FIGS. 3 and 4 in the interest of simplicity, they will continue to be used in the following explanation in the sense that they are used in FIGS. 1 and 2.

In the AND circuit 31 for an asynchronous complementary signal pair shown in FIG. 3, input variables Qa, Qb are applied to the inputs of a first invention elementary cell 20a, and complementary variables Qa__, Qb__ of the input variables are applied to the inputs of a second invention elementary cell 20b. The AND output Fa1 of the first elementary circuit 20a becomes the AND output Fa of the asynchronous AND circuit 31 and the OR output Fo2 of the second elementary cell 20b becomes the complementary (negative)

AND output Fa__ of the asynchronous AND circuit 31. After being split at branch points 32 and 35, the AND output Fa and the OR output Fo2 are added as indicated by an addition point 33 and the sum is applied to one input of a third invention elementary circuit 20c. The other input of the third elementary circuit 20c is applied with the sum obtained by adding the OR output Fo1 of the first elementary circuit 20a and the AND output Fa2 of the second elementary cell 20b at an addition point 34. As shown, the third elementary circuit 20c, while having the OR circuit section 21 and the AND circuit 22 contained therein, substantially uses only the AND circuit 22 and applies the AND output thereof to the elementary cell 20a as the reset signal Rs1 of the first elementary circuit 20a. Moreover, since the output terminal of the input enable signal EN1 of the first elementary circuit 20a is connected with the reset input terminal of the second elementary cell 20b, the reset signal Rs1 also becomes the reset signal Rs2 of the second elementary cell 20b.

In the circuit constituted in this manner, when one of the input pulses Qa, Qb having a significant level (logical "1") arrives before the other, then, according to the operation of the elementary cell 20 described earlier with reference to FIGS. 1 and 2, logical "1" is stored in the first arrival pulse memory section 23 included in the AND circuit 22 in the first elementary circuit 20a and, simultaneously, an OR output Fo1 is output by the OR circuit section 21 and applied to one input of the AND circuit 22 of the third elementary circuit 20c through the addition point 34, whereby the first arrival pulse memory section 23 included in the third elementary circuit 20c also stores logical "1". Then when the other input pulse arrives after a delay, an AND operation is performed between it and the logical "1" stored in the first arrival pulse memory section 23 of the AND circuit 22 in the first elementary circuit 20a, whereby an AND output Fa1 is output as the AND output Fa of the asynchronous AND circuit 31 and, simultaneously, the AND output Fa1 produced by the first elementary circuit 20a is split at the branch point 32 and applied through the addition point 33 to the other input of the AND circuit 22 in the third elementary circuit 20c. As a result, an AND operation is also performed in the third elementary circuit 20c and the resulting AND output becomes the reset signal Rs1 which resets the first elementary circuit 20a for enabling it to receive the next input signal.

When the input pulses Qa, Qb arrive simultaneously as logical "1", then, according to the operation of the invention elementary cell 20 described earlier with reference to FIGS. 1 and 2, the AND circuit 22 in the first elementary circuit 20a immediately, and without storing logical "1" in the first arrival pulse memory section 23, produces an AND output Fa1, which is output as the AND output Fa of the asynchronous AND circuit simultaneously with an OR output Fo1 output from the OR circuit section 21. This OR output Fo1 is applied to one input of the AND circuit 22 of the third elementary circuit 20c through the addition point 34 and, simultaneously, the AND output Fa1 from the first elementary circuit 20a is split at the branch point 32 and applied to the other input of the AND circuit 22 in the third elementary circuit 20c through the addition point 33, so that an AND operation is immediately performed in the AND circuit 22 of the third elementary circuit 20c without storing logical "1" in the first arrival pulse memory section 23. The resulting AND output pulse from the AND circuit 22 of the third elementary circuit 20c is applied to the reset signal Rs1 of the first elementary circuit 20a.

Next, the case where one of the input pulses Qa, Qb is applied as logical "0" will be considered. In this case, it is not possible to know only from observing the first elementary circuit 20a regarding only its affirmative input whether a logical "0" pulse has actually been applied or nothing has been applied. This is because, as explained earlier, the current or voltage level state of the signal propagation line is the same before and after arrival of a significant pulse in the case where one of the logical values is expressed in the form of pulse presence. However, in the case where, as shown in FIG. 3, a negative logic signal is handled, the fact that logical "0" is applied to the input of first elementary circuit 20a, for example, means that an input pulse Qa__ or Qb__ of logical "1" is applied to one input of the second elementary cell 20b. Therefore, since in this case an OR output Fo2 is output from the OR circuit section 21 of the second elementary cell 20b, this can be defined as the NAND output Fa__ of the asynchronous AND circuit 31. Therefore, when one of input pulses Qa, Qb is applied as logical "1" and the other is applied as logical "0," i.e. when one of the pair of affirmative inputs Qa, Qb and the other of a pair of negative inputs Qa__, Qb__ are both logical "1," the OR circuit sections 21 in the first and second elementary circuits 20a, 20b produce OR outputs Fo1, Fo2. As explained earlier, the OR output Fo2 from the OR circuit section 21 of the second elementary cell 20b is output as the NAND output Fa__ of the AND circuit 31 for a complementary signal pair. Since these outputs are applied to the inputs of the AND circuit 22 of the third elementary circuit 20c through the addition points 33, 34, the AND circuit 22 in the third elementary circuit 20c produces an AND output, utilizing the logical value recording operation of the first arrival pulse memory section 23 in the third elementary circuit 20c if the arrival times differ and immediately if they do not, which AND output serves as the reset signals Rs1, Rs2 for resetting the first and second elementary circuits 20a, 20b. Even if logical "1" is present in the first arrival pulse memory section 23 of the third elementary circuit 20c, which does not use the OR circuit section and uses only the AND circuit section, the logical "1" in the first arrival pulse memory section 23 is, as explained earlier, erased (the first arrival pulse memory section 23 and, accordingly, the third elementary circuit 20c is reset) at the time of the AND operation.

In the case where the affirmative inputs Qa, Qb are both applied as logical "0," since to the second elementary cell 20b this means that both inputs Qa__, Qb__ are logical "1," the second elementary cell 20b performs the same operations as explained regarding the first elementary circuit 20a when both affirmative inputs Qa, Qb are logical "1". As a result, the OR circuit section 21 produces an OR output Fo2 which is output as the NAND output Fa__ of the AND circuit 31 and applied to one input of the AND circuit 22 of the third elementary circuit 20c through the branch point 35 and the addition point 33. Since AND circuit 22 in the second elementary cell 20b produces an AND output Fa2 which is applied to the other input of the AND circuit 22 of the third elementary circuit 20c through the addition point 34, the AND circuit 22 of the third elementary circuit 20c produces an AND output pulse which is applied through the first elementary circuit 20a to the second elementary cell 20b as a reset signal Rs2, notwithstanding that the recording operation of the first arrival pulse memory sections 23 in the AND circuits 22 of the first elementary circuit 20a and the third elementary circuit 20c may or may not be utilized depending on whether or not the arrival times of the negative inputs Qa__, Qb__ differ.

The operation of the exclusive OR circuit 41 for an asynchronous complementary signal pair, which, as shown in FIG. 4, comprises four invention elementary cells 20, will now be explained. Input variables Qa, Qb are applied to the inputs of a first invention elementary cell 20a, and complementary variables Qa_, Qb_ of the input variables are applied to the inputs of a second invention elementary cell 20b. The AND output Fa1 of the first elementary circuit 20a and the AND output Fa2 of the second elementary cell 20b are added at an addition point 42, the sum becoming the exclusive NOR output Fx_ of the asynchronous exclusive OR circuit 41 and being applied through a branch point 44 and an addition point 45 to one input of the AND circuit 22 included in a third elementary circuit 20c.

The OR output Fo1 of the first elementary circuit 20a and the OR output Fo2 of the second elementary cell 20b are each input to one input of a fourth elementary circuit 20d. The AND output of the fourth elementary circuit 20d is output as the exclusive OR output Fx of the asynchronous exclusive OR circuit 41 and is applied to the aforesaid one input of the third elementary circuit 20c through a branch point 43 and the addition point 45, while the other input of the third elementary circuit 20c is applied with the OR output of the fourth elementary circuit 20d. As shown, the third elementary circuit 20c, while having the OR circuit section 21 and the AND circuit 22 contained therein, substantially uses only the AND circuit 22 and applies the AND output thereof to the elementary cell 20 as the reset signal Rs1 of the first elementary circuit 20a. The reset signal Rs1 is further applied to the reset input terminal of the second elementary cell 20b as an input enable signal EN1 from the first elementary circuit 20a, whereafter the input enable signal EN1 becomes a reset signal Rs2, which in turn becomes an input enable signal EN2 applied from the second elementary cell 20b to the reset input terminal of the fourth elementary circuit 20d as a reset signal Rs3.

In the circuit constituted in this manner, when one of the input pulses Qa, Qb having a significant level (logical "1") arrives, then, according to the operation of the elementary cell 20 described earlier with reference to FIGS. 1 and 2, logical "1" is stored in the first arrival pulse memory section 23 included in the AND circuit 22 in the first elementary circuit 20a and, simultaneously, an OR output Fo1 is output by the OR circuit section 21 and applied to one input of the AND circuit 22 of the fourth elementary circuit 20d, whereby the first arrival pulse memory section 23 included in the AND circuit 22 of the fourth elementary circuit 20d also stores logical "1". In addition, since an OR output is also produced by the OR circuit section 21 in the fourth elementary circuit 20d, logical "1" is also stored in the first arrival pulse memory section 23 included in the AND circuit 22 of the third elementary circuit 20c. For simplifying the following explanation, this state will be referred to as state A.

When the system is in state A and the other input pulse is applied as logical "0," no change occurs in the first elementary circuit 20a handling affirmative input logic, while the second elementary cell 20b handling negative input logic performs an OR operation and produces an OR output Fo2 which is applied to the other input of the AND circuit 22 in the fourth elementary circuit 20d, whereby the fourth elementary circuit 20d performs an AND operation and the resulting AND output pulse is output as the exclusive OR output Fx of the asynchronous exclusive OR circuit 41. Since the AND output of the fourth elementary circuit 20d is simultaneously applied to the other input of the AND circuit 22 in the third elementary circuit 20c through the branch point 43 and the addition point 45, the AND circuit 22 performs an AND operation, thereby sequentially applying reset signal pulses Rs1, Rs2, Rs3 to the first, second and fourth elementary circuits 20a, 20b, 20d to reset them to their initial state for receiving the next inputs. This normal exclusive OR operation occurs irrespective of whether or not the logical "1" input pulses Qa, Qb_ or Qa_, Qb arrive at different times or simultaneously. When the input pulses arrive simultaneously, the situation differs slightly from that just explained in the point that since the fourth elementary circuit 20d simultaneously performs the AND operation and immediately produces the AND output with no accompanying operation of storing logical "1" in the first arrival pulse memory section 23, and, moreover, since the OR output is simultaneously produced, the exclusive OR output Fx is output and the AND circuit 22 of the third elementary circuit 20c also immediately produces the AND output with no accompanying operation of storing logical "1" in its first arrival pulse memory section 23.

On the other hand, when the system is in state A and the other input pulse is applied as logical "1," the AND circuit 22 in the first elementary circuit 20a performs an AND operation and the resulting AND output Fa1 is output through the addition point 42 as the exclusive NOR output Fx_ of the asynchronous exclusive OR circuit 41. Since this output is applied to the other input of the AND circuit 22 of the third elementary circuit 20c through the branch point 44 and the addition point 45, the AND circuit 22, whose first arrival pulse memory section 23 contains logical "1," performs an AND operation and the resulting AND output becomes the reset signals Rs1, Rs2, Rs3 which reset the elementary circuits 20a, 20b, 20d.

If the input pulses Qa, Qb are simultaneously applied both as logical "1," the first elementary circuit 20a immediately performs an AND operation, whereby the exclusive NOR output Fx_ is output through the addition point 42 as anticipated. Since the exclusive NOR output Fx_ is simultaneously applied to one input of the AND circuit 22 of the third elementary circuit 20c through the branch point 44 and the addition point 45, while the OR output from the OR circuit section 21 of the first elementary circuit 20a is applied to the other input of the AND circuit 22 of the third elementary circuit 20c through the OR circuit section 21 in the fourth elementary circuit 20d, the AND circuit 22 of the third elementary circuit 20c immediately performs an AND operation and produces an AND output which provides the reset signals Rs1, Rs2, Rs3 of the elementary circuits 20a, 20b, 20d.

Similarly, if the input pulses Qa, Qb are both applied as logical "0," since this means that both negative inputs Qa_, Qb_ are logical "1," the second elementary cell 20b performs an AND operation, the exclusive NOR output Fx_ is output through the addition point 42 as anticipated, and the output exclusive NOR output Fx_ is applied to one input of the AND circuit section of the third elementary circuit 20c through the branch point 44 and the addition point 45. Since the OR output from the OR circuit section 21 of the second elementary cell 20b is applied to the other input of the AND circuit section of the third elementary circuit 20c through the OR circuit section in the fourth elementary circuit 20d, the third elementary circuit 20c performs an AND operation and produces AND output which provides the reset signals Rs1, Rs2, Rs3 of the elementary circuits 20a, 20b, 20d.

As will be understood from the foregoing, by use of the elementary cell according to the invention it is possible to efficiently and simply construct various. asynchronous superconducting logic circuits for handling complementary signal pairs. While it may seem inefficient to use an elementary cell 20 having internal circuit portions that are not utilized (as in the case of the third elementary circuit 20c in the example circuit configurations shown in FIGS. 3 and 4, whose OR circuit section and reset signal line are not used), it is in fact an advantage in light of certain volume production effects to tolerate such superfluous circuit portions in the interest of limiting the production to elementary cells of identical configuration. This is one of the main reasons for terming the invention circuit an "elementary cell." This policy promotes uniformity of circuit fabrication patterns, markedly simplifies the design and fabrication processes and, as a result, lowers cost and increases the reliability of circuit operation. It is worth noting here that the branch points 32, 35, 43 and 44 in FIGS. 3 and 4 can, in the manner of the amplification circuit configurations of the signal splitting sections 25a, 25b shown in FIG. 2(A), be provided with active signal splitting circuits such as the pulse amplifier 11 and the buffer amplifier 13, while, moreover, the addition points 33, 34, 42 and 45 can, if necessary, utilize the configuration of the OR circuit section 21 with pulse amplification capability shown in FIG. 2(B). Experts in the field will also be able to make various changes and modifications without departing from the scope of the appended claims.

What is claimed is:

1. An elementary cell for constructing asynchronous superconducting logic circuits, comprising:

two inputs each of which receives as an input pulse a logic signal pulse propagated as a single-flux-quantum;

an OR circuit section connected to the two inputs for producing an OR output pulse when an input pulse is applied to at least one of the two inputs;

a first arrival pulse memory section connected to the two inputs for recording arrival of an input pulse which arrives earlier at one of the two inputs; and an AND circuit section including said first arrival pulse memory section, connected to the two inputs for producing an AND output pulse when the arrival of the input pulse is recorded in said first arrival pulse memory section and an input pulse arrives at the other of the two inputs, and connected to a reset input terminal for erasing any content of said first arrival pulse memory section when it receives a reset signal pulse on the reset input terminal.

2. An elementary cell according to claim 1, wherein said AND circuit section produces an AND output pulse without recording the arrival of an input pulse when input pulses arrive at the two inputs simultaneously.

3. An elementary cell according to claim 1, wherein said OR circuit section is constituted by connecting the two inputs to a power source side of a non-latching Josephson switch, and the OR output pulse is obtained from the power source side.

4. An elementary cell according to claim 3, further comprising a pulse amplifier for amplifying the OR output pulse including a non-latching Josephson switch.

5. An elementary cell according to claim 1, wherein said first arrival pulse memory section comprises:

a closed superconducting loop including in serial connection first, second and third non-latching Josephson switches and an inductor having inductance in a range enabling capture of one single-flux-quantum;

said first non-latching Josephson switch being applied with power source current and the input pulses to the two inputs;

said second non-latching Josephson switch being applied with only the input pulses applied to the two inputs;

the reset signal pulse being applied to one terminal of said third non-latching Josephson switch;

said first non-latching Josephson switch shifting to a voltage state for a prescribed period of time for capturing a single-flux-quantum in said closed superconducting loop when an input pulse is applied to one of the two inputs at a time when no single-flux-quantum is captured by said closed superconducting loop;

said second non-latching Josephson switch shifting to a voltage state for a prescribed period of time for producing an AND output pulse when an input pulse is applied to one of the two inputs at a time when a single-flux-quantum is captured by said closed superconducting loop; and said third non-latching Josephson switch shifting to a voltage state for a prescribed period of time for discharging from said closed superconducting loop the single-flux-quantum captured by said closed superconducting loop when the reset signal pulse is applied at a time when the single-flux-quantum is captured by said closed superconducting loop.

6. An elementary cell according claim 5, further comprising a pulse amplifier for amplifying the AND output pulse including a non-latching Josephson switch.

7. An elementary cell according to claim 5, further comprising a non-latching Josephson switch which is provided in a signal line for applying a reset signal pulse to said third non-latching Josephson switch and which operates to prevent capture of a single-flux-quantum by said closed superconducting loop from being caused by a shift to the voltage state owing to application of the reset signal pulse when no single-flux-quantum is captured by said closed superconducting loop.

8. An elementary cell according to claim 5, wherein said OR circuit section is constituted to share said first non-latching Josephson switch for constituting said first arrival pulse memory section, the two inputs are connected to the power terminal side of said first non-latching Josephson switch, and the OR output pulse is obtained from the power terminal side.

9. An elementary cell according to claim 8, further comprising a pulse amplifier for amplifying the OR output pulse including a non-latching Josephson switch.

10. An elementary cell according to claim 1, further comprising an amplification circuit which includes a pulse amplifier using a non-latching Josephson switch and is connected to the two inputs at a signal splitting section for distributing the two inputs to two inputs of said AND circuit section and two inputs of said OR circuit section.

11. An elementary cell according to claim 10, further comprising a buffer amplifier for preventing reverse flow of signals from the side of the two inputs of said AND circuit section and the two inputs of said OR circuit section after distribution of the two inputs.

12. An elementary cell according to claim 1, further comprising an output terminal which passes the reset signal pulse upon receiving the reset signal pulse.

\* \* \* \* \*